United States Patent
Fujishima

(10) Patent No.: US 10,545,415 B2
(45) Date of Patent: Jan. 28, 2020

(54) DETECTION APPARATUS, PATTERN FORMING APPARATUS, OBTAINING METHOD, DETECTION METHOD, AND ARTICLE MANUFACTURING METHOD

(71) Applicant: CANON KABUSHIKI KAISHA, Tokyo (JP)

(72) Inventor: Hironobu Fujishima, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/926,258

(22) Filed: Mar. 20, 2018

(65) Prior Publication Data
US 2018/0275535 A1 Sep. 27, 2018

(30) Foreign Application Priority Data
Mar. 24, 2017 (JP) .................... 2017-059923

(51) Int. Cl.
*G03F 9/00* (2006.01)
*G03F 7/20* (2006.01)

(52) U.S. Cl.
CPC ............ *G03F 9/7088* (2013.01); *G03F 7/707* (2013.01); *G03F 7/7085* (2013.01); *G03F 7/70216* (2013.01); *G03F 9/708* (2013.01); *G03F 9/7084* (2013.01); *G03F 2009/005* (2013.01)

(58) Field of Classification Search
CPC .............................. G03F 9/7084; G03F 9/7088
See application file for complete search history.

(56) References Cited

U.S. PATENT DOCUMENTS

| | | | | |
|---|---|---|---|---|
| 7,084,955 | B2* | 8/2006 | Gui | G03F 7/70216 355/53 |
| 9,826,201 | B2* | 11/2017 | Goehnermeier | H04N 7/183 |
| 2002/0109825 | A1* | 8/2002 | Gui | G03F 7/70216 355/53 |
| 2003/0224262 | A1 | 12/2003 | Lof et al. | |
| 2005/0248740 | A1* | 11/2005 | Veen | G03F 7/70425 355/53 |

(Continued)

FOREIGN PATENT DOCUMENTS

| | | |
|---|---|---|
| EP | 1341046 A2 | 9/2003 |
| EP | 1477861 A1 | 11/2004 |
| JP | 3637024 B2 | 4/2005 |

OTHER PUBLICATIONS

Extended European Search Report issued in European Appln. No. 18000231.3 dated Sep. 18, 2018.

*Primary Examiner* — Shawn Decenzo
(74) *Attorney, Agent, or Firm* — Rossi, Kimms & McDowell LLP

(57) ABSTRACT

A detection apparatus that detects a mark formed on a substrate is provided. The detection apparatus includes a substrate holder configured to hold the substrate, an optical system accommodated in the substrate holder, an image sensor configured to capture an image of the mark from the reverse surface side of the substrate through the optical system, and a processor configured to perform detection processing for the mark based on the image of the mark captured by the image sensor. The processor corrects a detection value of the mark based on the position of the mark on the substrate in the height direction and information concerning the telecentricity of the optical system.

20 Claims, 5 Drawing Sheets

(56) References Cited

U.S. PATENT DOCUMENTS

2006/0023214 A1 2/2006 Lof et al.
2006/0292463 A1* 12/2006 Best .................... G03F 7/70633
  430/22
2009/0268178 A1* 10/2009 Shibazaki ........... G03F 7/70425
  355/53
2017/0184980 A1* 6/2017 Bogaart .............. G03F 7/70633

* cited by examiner

DETECTION APPARATUS, PATTERN FORMING APPARATUS, OBTAINING METHOD, DETECTION METHOD, AND ARTICLE MANUFACTURING METHOD

BACKGROUND OF THE INVENTION

Field of the Invention

The present invention relates to a detection apparatus, a pattern forming apparatus, an obtaining method, a detection method, and an article manufacturing method.

Description of the Related Art

In general, an exposure apparatus as an example of a lithography apparatus (pattern forming apparatus) is configured to observe, with a microscope, an alignment mark transferred onto a substrate at an early stage of exposure, perform positioning using the resultant position information, and perform overlay exposure. There are various types of intermediate processes such as CMP (Chemical Mechanical Polishing) and thermal annealing between overlay exposure processes. This may lead to a failure to maintain the mark on the substrate in a proper state.

As a countermeasure against this problem, there is conceivable a technique of performing alignment, when silicon is used as a material for a substrate, by providing a mark on the reverse side of a substrate and observing the mark on the reverse side of the substrate from the obverse side of the substrate by using light of an infrared wavelength that is transmitted through the silicon.

However, depending on devices, an opaque layer made of a metal or the like may be formed on a mark. This may require a process of performing positioning by using the mark covered by the layer. In such a case, it is not possible to observe the mark even with a microscope using a wavelength that is transmitted through the substrate.

Japanese Patent No. 3637024 discloses an exposure apparatus including an alignment system that can cope with such a situation. A substrate holder in Japanese Patent No. 3637024 has a relay optical system embedded in it to extract an image of a mark provided on the reverse surface of a substrate to the outside of the substrate. This makes it possible to perform alignment by observing, with a microscope, an intermediate image of the mark formed by the relay optical system.

When, however, a relay optical system is provided between a microscope and a mark, the aberration of the relay optical system greatly influences alignment accuracy. The relay optical system needs to be small to be embedded in the substrate holder, and adjustment after being embedded is not easy. In order to implement a high-accuracy alignment system, it is essentially necessary to correct an error caused by the aberration of the relay optical system.

It is generally important to correct distortion among aberrations in an alignment system. On the other hand, in an exposure apparatus aiming at coping with various types of device manufacturing processes, it is primarily important to perform correction concerning the tilt of a principal ray at each image height of the relay optical system. In short, it is difficult to correct distortion without correcting the tilt of a principal ray at each image height.

When a principal ray passing through a pupil center is parallel to the optical axis of an optical system, this state is referred to as "the optical system is telecentric". This is a widely known concept that guarantees that even when an object is defocused, its image only blurs but does not shift horizontally. Although microscopes and relay optical system are designed to be telecentric as much as possible, errors in the manufacture and the like make it extremely difficult to prevent the occurrence of a tilt of a principal ray at each image height.

Depending on device manufacturing processes, the mark provided on the reverse surface of a substrate is not always located at a constant height near a boundary plane between the mark and a substrate holder. For example, when one or two or more layers are further stacked to sandwich the mark provided on the reverse surface of a substrate, the distance (the height position of the mark) between the mark and the substrate holding surface of the substrate holder can change.

When the tilt of a principal ray at each image height remains in the relay optical system in such a situation, the image height of a mark image observed through the exit of the relay optical system changes in accordance with the height position of the mark. The influence of distortion is often eliminated by computation upon grasping a specific image height in the visual field of the optical system at which an image of a target object is located. If, however, no means for correcting the influence of the tilt of a principal ray at each image height is provided, the image height of the mark itself changes depending on the defocus amount of the mark. This makes such distortion correction itself insufficient.

Note that it cannot be generally expected that the mark on the substrate held by the substrate holder is accurately located in the visual field center of the relay optical system. In addition, once the relay optical system is embedded in the substrate holder, it is difficult to move the relay optical system. This makes it difficult to adjust the mark to the visual field center of the relay optical system with less distortion.

SUMMARY OF THE INVENTION

The present invention provides a technique advantageous in improving the accuracy of positioning using an optical system accommodated in a substrate holder.

According to one aspect of the present invention, a detection apparatus that detects a mark formed on a substrate is detected. The apparatus comprises a substrate holder configured to hold the substrate, an optical system accommodated in the substrate holder, an image sensor configured to capture an image of the mark from a reverse surface side of the substrate through the optical system, and a processor configured to perform detection processing for the mark based on the image of the mark captured by the image sensor, wherein the processor is configured to correct a detection value of the mark based on a position of the mark on the substrate in a height direction and information concerning telecentricity of the optical system.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

The embodiments of the present invention will be described in detail below with reference to the accompanying drawings. Note that the following embodiments are merely specific examples of embodiments of the present invention, and do not limit the present invention. In addition, not all combinations of characteristic features described in the following embodiments are essential to the solution of the problem in the present invention.

A detection apparatus according to the present invention is a detection apparatus that detects marks formed on substrates, and can be applied to the positioning of substrates in lithography apparatuses (pattern forming apparatuses) such as exposure apparatuses and imprint apparatuses. In addition, this detection apparatus can be applied to other apparatuses such as processing apparatuses, inspection apparatuses, and microscopes. The following will exemplify a case in which a detection apparatus according to the present invention is applied to an exposure apparatus.

First Embodiment

Figure 1:
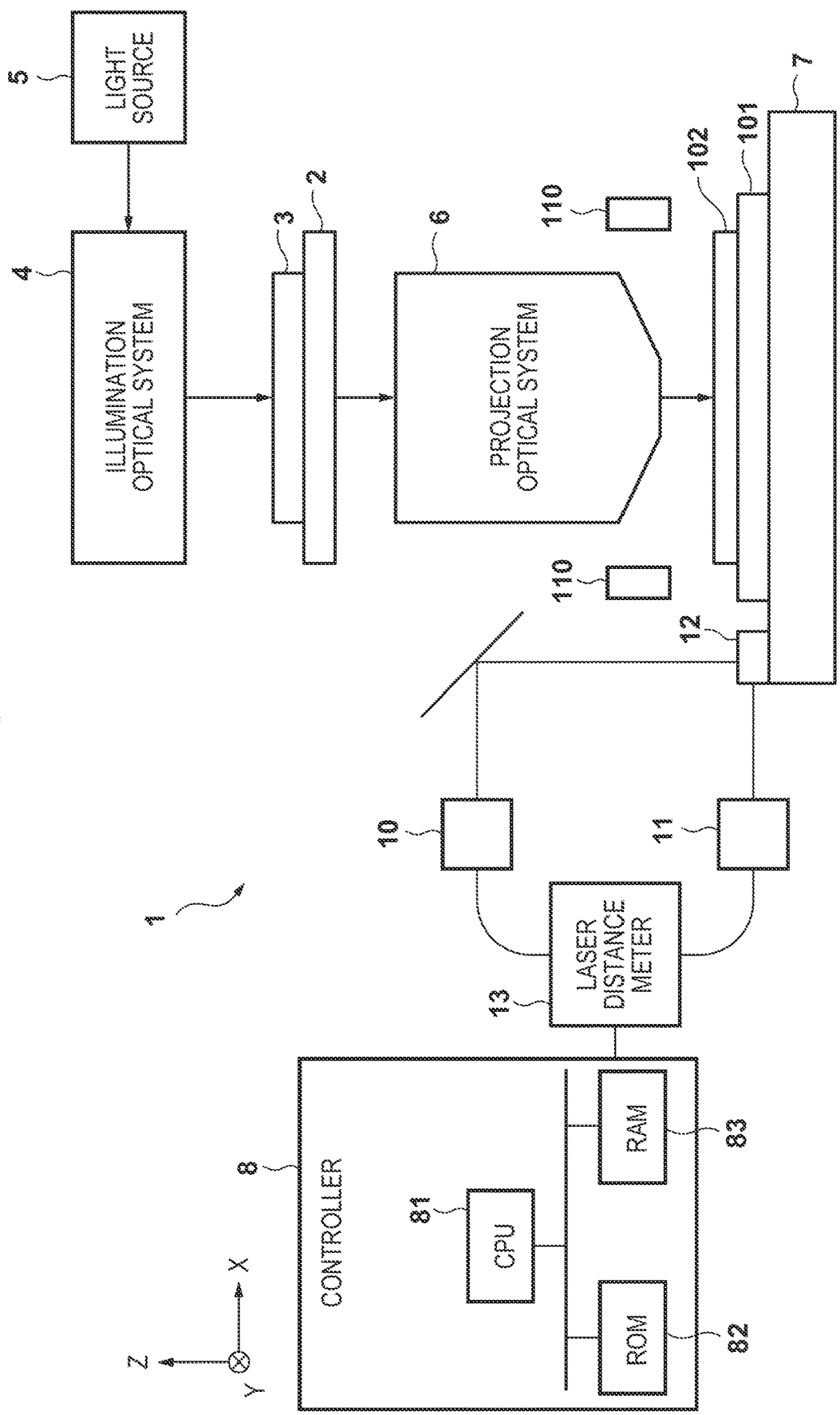
FIG. 1 is a view showing the arrangement of an exposure apparatus to which a detection apparatus according to an embodiment is applied.

FIG. 1 is a view showing the arrangement of an exposure apparatus 1 as an example of a lithography apparatus to which a detection apparatus of the present invention is applied. In the exposure apparatus 1, an original holder 2 holds an original (mask or reticle) 3. An illumination optical system 4 irradiates the original 3 held by the original holder 2 with light from a light source 5. A projection optical system 6 projects light transmitted through the original 3 onto a substrate (wafer) 102. The substrate 102 is held by a substrate holder (chuck) 101 such as a holder using vacuum suction. A substrate holder 7 configured to be movable supports the substrate holder 101. The substrate holder 101 is detachably mounted on the substrate holder 7 in this case, but may be integrally formed with the substrate holder 7. The substrate holder 7 includes, for example, a six-axis driving mechanism with X, Y, Z, ωx, •Y, and ωZ axes, and performs driving operations based on instruction values from a controller 8. The current position of the substrate holder 7 is obtained by measuring, with a laser distance meter 13, light applied from laser heads 10 and 11 and reflected by a mirror 12 on the substrate holder and then converting the reflected light into a posture amount. The controller 8 obtains the current position of the substrate holder 7 from the laser distance meter 13, and generates a new drive instruction value to perform feedback control, thereby maintaining the posture of the substrate holder 7.

An imaging optical system 110 functions as an alignment measuring device and measures a relative positional shift between the original 3 and the substrate 102. The imaging optical system 110 can measure the coordinates of a predetermined position in each of a plurality of shot regions.

The controller 8 comprehensively controls the respective units of the exposure apparatus 1. The controller 8 can include, for example, a CPU 81, a ROM 82 holding control programs and fixed data, and a RAM 83 having a work area for the CPU 81 and holding temporary data. Accordingly, the controller 8 can be implemented by a dedicated or general-purpose computer device. The controller 8 according to this embodiment executes exposure processing based on control information (for example, shot layout information, a projection magnification, and a scanning direction) associated with exposure stored in the RAM 83. The controller 8 also functions as a processing unit that performs mark detection processing based on an image of a mark obtained by the imaging optical system 110 (to be described later).

The exposure apparatus 1 according to this embodiment can be, for example, a scanning exposure apparatus that performs exposure while relatively driving an original and a substrate. In manufacturing a semiconductor device, in general, a plurality of layers forming a pattern are superimposed on a substrate while being aligned. For example, the apparatus executes an exposure process so as to superimpose a second layer on which a pattern is formed by second exposure on a first layer on a substrate on which a pattern is formed by first exposure.

Figure 2:
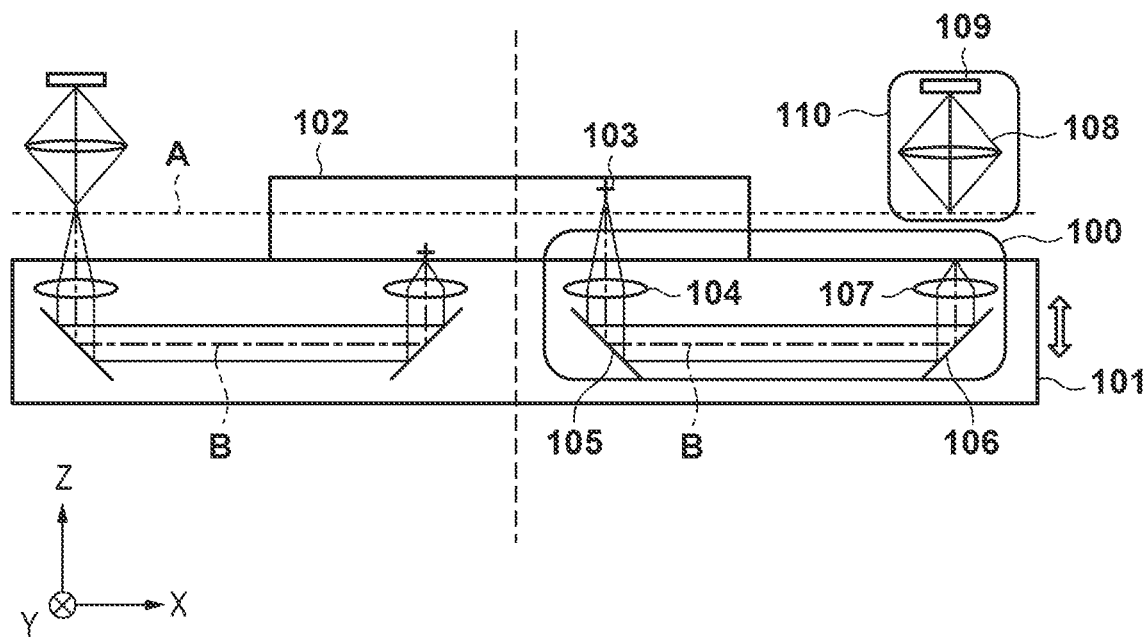
FIG. 2 is a view showing the arrangement of the main part of the detection apparatus according to the embodiment.

FIG. 2 is a view showing the arrangement of the main part of the detection apparatus in the exposure apparatus 1 described above. The detection apparatus according to this embodiment can include a relay optical system (imaging optical system) 100 accommodated in the substrate holder 101 and the imaging optical system 110. A mark 103 for positioning is formed on the substrate 102. The mark 103 is sometimes located on the upper surface of the substrate 102 as exemplarily shown on the right side of FIG. 2, and is sometimes located on the lower surface of the substrate 102 as exemplarily shown on the left side of FIG. 2. Furthermore, the mark 103 can be located at any height position between the upper surface and the lower surface of the substrate 102 in an actual device manufacturing process.

The wavelength of light used in this embodiment is assumed to belong to a band that can be transmitted through the substrate 102. For example, such light can be assumed to be near-infrared light belonging to a band from 800 nm or more to 1,400 nm or less under conditions that light can be transmitted through a silicon substrate and a glass substrate and an optical system can be formed from a general glass material. Reflected and diffracted light from the mark 103 formed on the substrate 102 reaches a deflecting mirror 105 through a lens 104. The optical path of the light is bent by 90° by the deflecting mirror 105 and reaches a deflecting mirror 106. The terms "deflecting mirror 105" and "deflecting mirror 106" are merely for convenience. In practice, therefore, various types of prisms and the like can be used as long as they match the purpose of changing the optical path by 90°. The reflected and diffracted light from the mark 103 passes through the deflecting mirror 106 and then formed into an image by a lens 107, thereby forming an aerial image (intermediate image) at a position outside the substrate 102. An optical system from the lens 104 to the lens 107 through the deflecting mirror 105 and the deflecting mirror 106 forms the relay optical system 100. Note that this optical arrangement of the relay optical system 100 is merely exemplary, and may include other optical elements or a different number of optical elements.

The imaging optical system 110 irradiates the mark 103 with light from the reverse surface side of the substrate through the relay optical system 100, and forms an image of the mark 103 on the light-receiving surface of a sensor 109 formed from an image sensor by using the light reflected by the mark 103 and passing through the relay optical system 100. The aerial image of the mark 103 formed by the relay optical system 100 is guided to the sensor 109 by a lens 108 in the imaging optical system 110. Although the lens 108 and the sensor 109 constitute the imaging optical system 110, this arrangement is exemplary, and the lens 108 is a single lens merely representing a plurality of optical elements. The imaging optical system 110 functions as an imaging device. Furthermore, the relay optical system 100 substantially has the function of a microscope. Accordingly, light to be transmitted through the substrate 102 can also be supplied from the imaging optical system 110 to the substrate 102. Note that the image sensor may be accommodated in the substrate holder 101, and light from a mark may be formed into an image on the image sensor surface through the imaging optical system.

FIG. 2 shows two each of the relay optical systems 100 and the imaging optical systems 110. Note, however, that at least one imaging optical system 110 is required. The two relay optical systems 100 are preferably provided for rotation correction of the substrate 102, and the ideal magnification of each system is 1.

Comparing the right side and the left side of FIG. 2 indicates how the height at which an aerial image is formed changes in accordance with a position z of the mark 103 on the substrate in the height direction (to be also simply referred to as a "height position" hereinafter). Because the plane on which the imaging optical system 110 is in focus is fixed to dotted line A drawn parallel to the x-axis, the focus can be set on an aerial image of the mark 103 by moving the substrate holder 7 in the z direction.

Referring to FIG. 2, principal ray B from the relay optical system 100, which is indicated by the chain line, is not parallel to either of the x-axis and the z-axis in FIG. 2 drawn parallel to the design optical axis of the relay optical system 100. When the tilt of a principal ray at each image height remains, the image of the mark 103 at the height position z, which is formed on the sensor 109, shifts in the x-axis direction in proportion to the height position z, as compared with a case in which a principal ray has no tilt at each image height.

In an actual device manufacturing process, various layers are added to the substrate 102 along with the process, and the height position z of the mark 103 on the substrate changes. For this reason, the conventional correction method is insufficient, is the method being configured to correct distortion only from image height information of the mark 103 in the visual field of the relay optical system 100, assuming that the height position z of the mark 103 is always conjugate to a focal plane of the imaging optical system 110.

In contrast to this, according to this embodiment, the exposure apparatus 1 obtains information concerning the tilt (telecentricity) of a principal ray at each image height of the relay optical system 100, together with information concerning the aberration of the system. The embodiment can therefore provide an alignment system that is far more accurate than the conventional system and can cope with various processes.

A specific method of obtaining information concerning the aberration of the relay optical system and information concerning the tilt of a principal ray at each image height will be described below. The following obtaining method is an example, and various other obtaining methods are conceivable.

In the object-side visual field of the relay optical system 100, (x, y) represents the coordinates of the mark 103 at height position z=0, and (x', y') represents the coordinates of the mark 103 in the image-side visual field of the relay optical system 100 as a result of passing through the relay optical system 100. This embodiment is configured to implement a technique of estimating the coordinates (x, y) of the mark 103 on the substrate 102 on the substrate holder 101 from the coordinates (x', y') of the mark 103 observed through the relay optical system 100.

It is expected that the object-side visual field coordinates (x, y) and the image-side visual field coordinates (x', y') of the relay optical system 100 have a one-to-one correspondence like that represented by the following equations:

$$x'=f(x,y)$$
$$y'=g(x,y) \quad (1)$$

In equations (1), functions f and g define a one-to-one correspondence, and hence the object-side visual field coordinates (x, y) are represented by new functions f' and g' as given below:

$$x=f'(x',y')$$
$$y=g'(x',y') \quad (2)$$

Functions f' and g' in equations (2) are expanded into polynomials with the coordinates x' and y' as follows:

$$x=f'(x',y')=x'+\Sigma cx\_mn(x')m(y')n$$
$$y=g'(x',y')=y'+\Sigma cy\_mn(x')m(y')n \quad (3)$$

The above expansion can be said to be natural in consideration of the fact that the influence of distortion increases as the image-side visual field coordinates (x', y') increase, and a sum signal ($\Sigma$) takes from m=0 to m_max, and from n=0 to n_max. From a logical viewpoint, the values of m_max and n_max are arbitrary natural numbers, which are about 3 to 4 in practice.

Equations (3) indicate that if all the values of expansion coefficients cx_mn and cy_mn are known, the object-side visual field coordinates (x, y) of the relay optical system 100 at which the substrate 102 as a real object is located can be reconstructed based on the coordinates (x', y') observed on the image side of the relay optical system 100.

A total of 16 expansion coefficients cx_mn and cy_mn exist if, for example, m_max=n_max=3. All these coefficients can therefore be determined by 16 independent equations.

Figure 3:
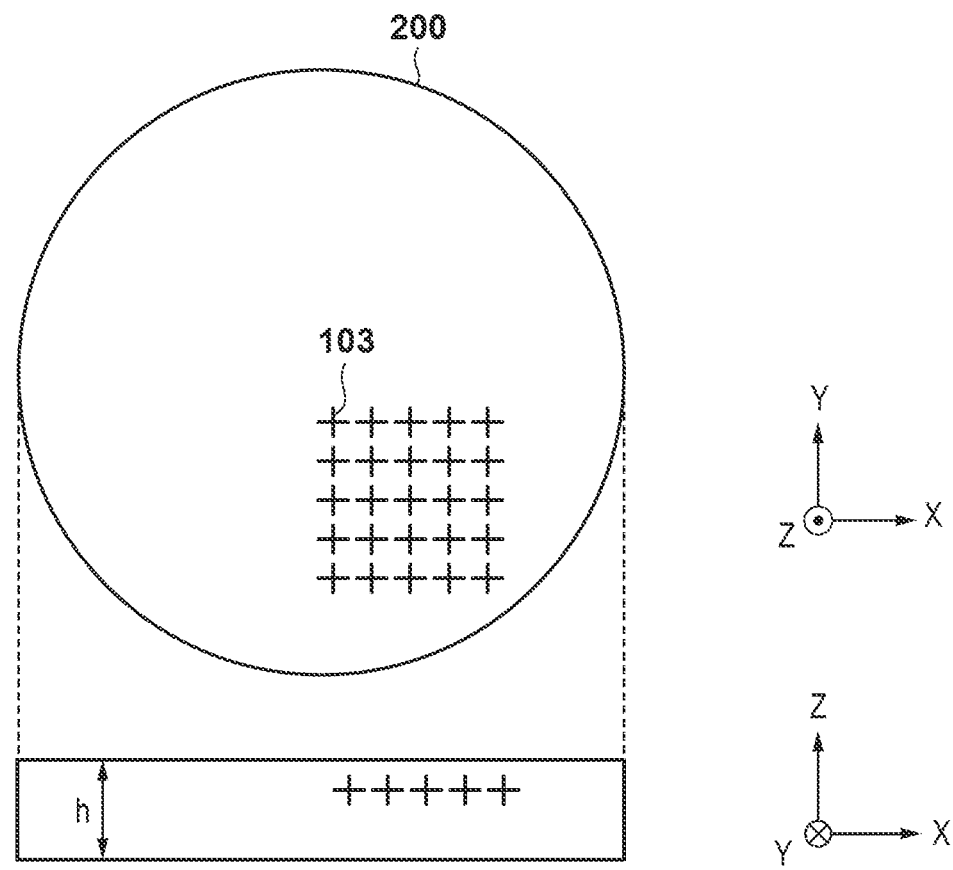
FIG. 3 is a schematic view of an adjustment substrate.
Figure 5:
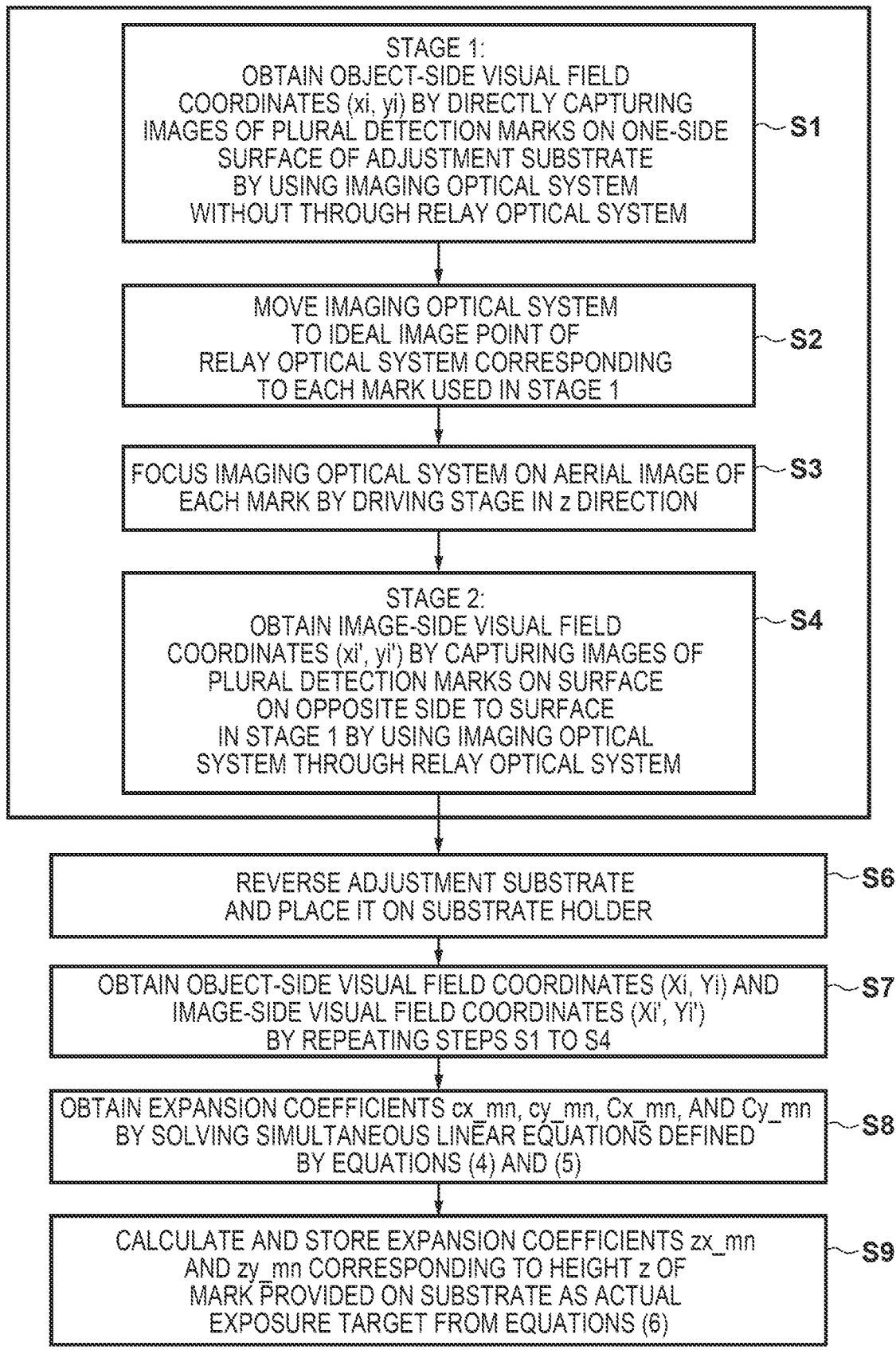
FIG. 5 is a flowchart showing adjustment processing for obtaining the relationship between image-side visual field coordinates and object-side visual field coordinates of the relay optical system.

FIG. 5 is a flowchart showing adjustment processing, implemented by the controller 8, for obtaining the relationship between the image-side visual field coordinates (x', y') and the object-side visual field coordinates (x, y) of the relay optical system 100. In order to form a combination of equations described below, two-stage measurement like that described above is performed for an adjustment substrate 200 having a thickness n which at least partially has a portion where the marks 103 are arranged in a square lattice pattern on one obverse surface like that shown in FIG. 3. Obviously, when the substrate 102 actually serving as an exposure target can function as the adjustment substrate 200, they need not be discriminated from each other. Although a plurality of marks 103 may be formed on either of the surfaces of the adjustment substrate 200, it is assumed that the marks are formed on the upper surface of the adjustment substrate 200, and the surface on the opposite side is in contact with the substrate holder 101.

(Stage 1)

Figure 4:
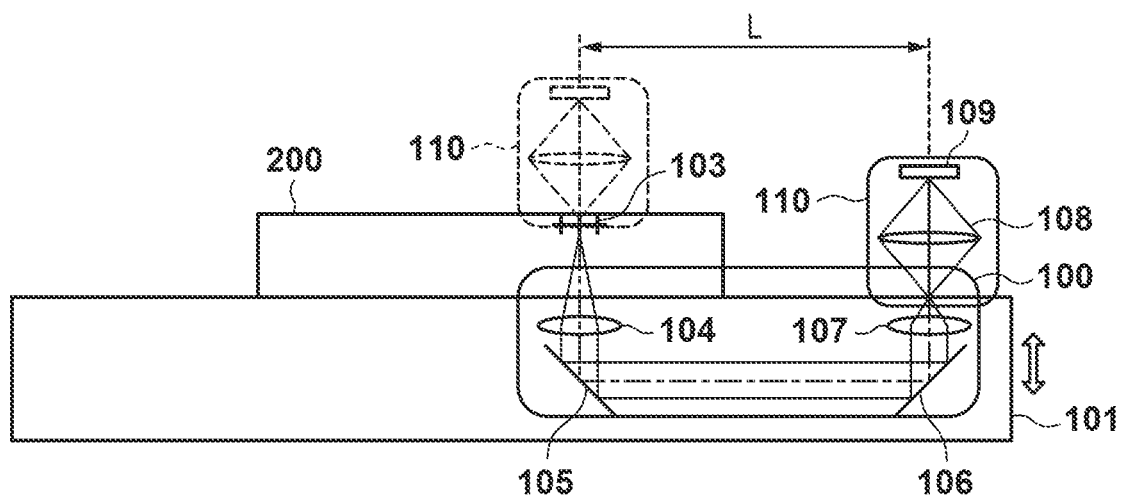
FIG. 4 is a view for explaining adjustment processing for obtaining the relationship between image-side visual field coordinates and object-side visual field coordinates of a relay optical system.

The controller 8 selects one of the marks 103 (first marks) from the adjustment substrate 200, directly captures the mark in the visual field center of the imaging optical system 110 which is located at the position indicated by the broken lines in FIG. 4, and defines an object-side visual field origin (0, 0) of the relay optical system 100 on the stage coordinates. In measurement in stage 1, marks are imaged from the obverse surface side of the adjustment substrate 200 without through the relay optical system 100. Labeling a plurality of marks 103 with natural numbers i makes it possible to obtain object-side visual field coordinates (xi, yi) (first detection value) of the relay optical system 100 as relative stage coordinates upon adjusting the ith mark 103 to the visual field center of the imaging optical system 110 in the same manner as described above (step S1). Information concerning the position of an object in the visual field of the relay optical system is formed from the read value of such stage relative coordinates. Note that because the visual field center of the imaging optical system 110 is used, the influence of distortion on the imaging optical system 110 can be ignored.

The controller 8 then selects one of the marks 103 from the adjustment substrate 200 and captures an aerial image of the mark through the relay optical system 100 by using the imaging optical system 110 located at the position indicated by the solid lines in FIG. 4 (step S2). Assume that in stage 1, the imaging optical system 110, which has been located at the position indicated by the dotted lines, is located at the position indicated by the solid lines by being moved by L toward the design ideal image point of the relay optical system 100 in the horizontal direction. In this case, the controller 8 focuses the imaging optical system 110 on the aerial image of the mark 103 by driving the substrate holder 7 in the z direction (that is, performs focus adjustment) (step S3). Assume that when the relay optical system 100 includes a prism or the like at which the reversal of an image occurs, the movement of the system to the ideal image point includes such reversal.

(Stage 2)

If the relay optical system 100 is an ideal one, an image of the selected mark 103 should be captured in the visual field center of the imaging optical system 110 upon movement to an ideal image point. In practice, however, the image is detected at a position shifted from the visual field center upon reception of the influence of the aberration of the relay optical system 100. In order to capture the image in the visual field center, the stage needs to be further moved by (dx, dy). With the added stage movement amount (dx, dy), the image-side visual field coordinates (x', y') of the relay optical system 100 are defined as x'=x−dx and y'=y−dy. Performing the above operation for all ith marks 103 can obtain combinations (x'i, y'i) (second detection values) of the image-side visual field coordinates of the relay optical system 100 (step S4).

Referring back to equations (3), a combination of simultaneous linear equations can be obtained.

$$xi = f'(x'i, y'i) = x'i + \Sigma cx\_mn(x'i)m(y'i)n$$

$$yi = g'(x'i, y'i) = y'i + \Sigma cy\_mn(x'i)m(y'i)n \quad (4)$$

All values xi, yi, x'i, and y'i appearing in equations (4) are known values through measurement in stages 1 and 2. Every time one value i is determined, a total of two equations for x- and y-direction components are obtained. When 16 independent equations are required, measurement in stages 1 and 2 may be performed for at least eight marks 103.

Obviously, measurement may be performed at more points. In this case, the uniqueness of the solutions of the simultaneous linear equations defined by equations (4) is lost. It is, however, widely known that the tolerance against measurement errors can be improved by using the least squares method.

The influence of the tilt of a principal ray at each image height of the relay optical system 100 is then evaluated. As one of measures for this operation, the adjustment substrate 200 that has been used is reversed and placed on the substrate holder 101 (step S6). A plurality of marks 103 located on the upper surface (first height position) of the adjustment substrate 200 then shift to a position (second height position) on the substrate holder 101 side. That is, the position of each mark on an adjustment substrate is changed between the first and second height positions by reversing the adjustment substrate. In this state, stages 1 and 2 described above (steps S1 to S4) are repeated in the same manner to obtain object-side visual field coordinates (Xi, Yi) and image-side visual field coordinates (X'i, Y'i) (step S7). This solves the combination of the simultaneous linear equations concerning the expansion coefficients Cx_mn and Cy_mn represented by the following equations, thus obtaining the expansion coefficients Cx_mn and Cy_mn (step S8).

$$Xi = X'i + \Sigma Cx\_mn(X'i)m(Y'i)n$$

$$Yi = Y'i + \Sigma Cy\_mn(X'i)m(Y'i)n \quad (5)$$

The operation described above makes it possible to evaluate an image shift caused by the relay optical system 100 between two planes between which the height position z of the mark 103 has changed by a thickness h of the adjustment substrate 200, that is, the influence of distortion. It is rational to use a linear interpolation method depending on the height position z of the mark 103 as long as the thickness h of the adjustment substrate 200 does not much differ from that of a substrate used in an actual manufacturing process. Accordingly, expansion coefficients zx_mn and zy_mn on a plane at an arbitrary height position z are defined by $$zx\_mn = Cx\_mn - (z \cdot n0/hn)(Cx\_mn - cx\_mn)$$

$$zy\_mn = Cy\_mn - (z \cdot n0/hn)(Cy\_mn - cy\_mn) \quad (6)$$

In equations (6), n represents the refraction index of the substrate 102 in actual use, and n0 represents the refraction index of the adjustment substrate 200. The controller 8 stores the expansion coefficients zx_mn and zy_mn calculated according to equations (6) in, for example, the RAM 83 (step S9).

The expansion coefficients zx_mn and zy_mn are coefficients dependent on the height position z according to equations (6). Equations (6) indicate that when the height position z of the mark 103 is 0, that is, the mark 103 is in contact with the substrate holder 101, the expansion coefficients zx_mn and zy_mn coincide with the expansion coefficients Cx_mn and Cy_mn. In addition, with regard to the adjustment substrate 200, when the height position z of the mark 103 is the upper limit position, that is, the height position z corresponds to a value equal to the thickness h of the substrate, the expansion coefficients zx_mn and zy_mn obviously coincide with the expansion coefficients cx_mn and cy_mn.

With the above processing, correction functions represented by the following equations are obtained, which have detection values (x'i, y'i) of the position of a detected mark as variables.

$$xi = x'i + \Sigma zx\_mn(x'i)m(y'i)n$$

$$yi = y'i + \Sigma zy\_mn(x'i)m(y'i)n \quad (7)$$

According to equations (7), the object-side visual field coordinates (xi, yi) and the image-side visual field coordinates (x'i, y'i) are redefined when the height position of each mark 103 is z.

The obtaining method of obtaining information concerning aberration and telecentricity as characteristic information of the relay optical system has been described above. This processing can be executed in a calibration mode, as needed, for example, at an early stage of an operation.

Note that information concerning the aberration and telecentricity of the relay optical system may be obtained by actual measurement performed in the above manner or estimated based on simulation results based on the design values of the relay optical system and the imaging optical system.

In an actual operation (exposure), the controller 8 obtains the shift amount of the imaging position of a mark from the visual field center of the imaging optical system 110 for each shot. With the above processing, the controller 8 can correct the obtained shift amount by reading out the expansion coefficients zx_mn and zy_mn stored in the RAM 83 and using equations (7) together with the obtained shift amount (refer to the fourth embodiment).

With the above operation, the coordinates of the mark 103 after correction with respect to the height position z of an arbitrary mark 103 can be calculated, and the image shift amount of the mark 103 caused by the relay optical system 100 can be corrected with ease and high accuracy in consideration of the influence of the tilt of a principal ray at each image height.

Second Embodiment

An exposure apparatus according to the second embodiment will be described next. In the first embodiment, after the substrate holder 101 is set on the substrate holder 7, information concerning the aberration of the relay optical system 100 and the tilt of a principal ray at each image height is obtained by actual measurement. This information will be referred to as initial information concerning the relay optical system 100. Executing an exposure sequence many times makes it necessary to perform temporal correction for the initial information for the following reason. The second embodiment will exemplify this correction.

In the exposure apparatus, a light source 5 emits energy in all directions in the exposure apparatus. Such energy also influences a substrate holder 101. The substrate holder 101 can also be heated and expand due to the energy of exposure light through a substrate 102. When an exposure operation by the exposure apparatus enters a pause state, the substrate holder 101 is cooled and contracts. When, therefore, the operation time of the exposure time increases and the number of processed substrates increases, it is necessary to perform correction in consideration of information concerning expansion/contraction of the substrate holder 101 in addition to the initial information.

An estimated deformation amount due to the extraction/contraction of the substrate holder 101 can be obtained by the following simulation under conditions complying with a provided exposure recipe and an exposure mode. A controller 8 or an external arithmetic device may perform this simulation.

Figure 6:
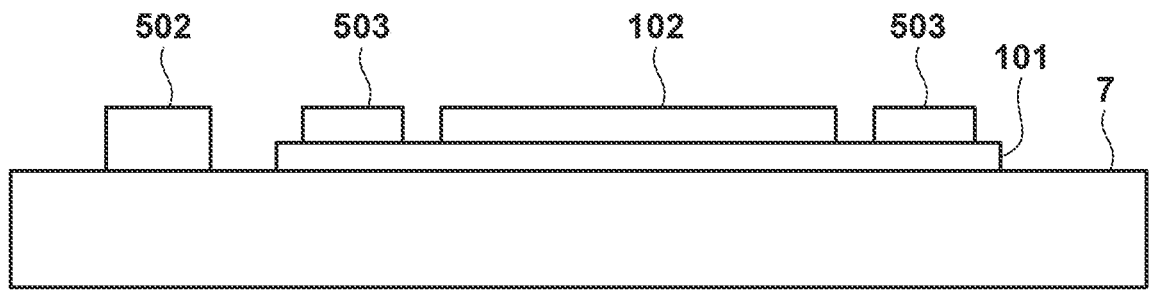
FIG. 6 is a view for explaining correction processing with consideration to information associated with expansion/contraction of a substrate holder.

First of all, the controller 8 starts the operation with grasping characteristics associated with the expansion/contraction of the substrate holder 101. In the exposure apparatus, the substrate holder 101 is mounted on a substrate holder 7, as shown in FIG. 6. A reference mark 502 is placed on the substrate holder 7 as a reference for the measurement of the movement amount of the substrate holder 7. A plurality of reference marks 503 are arranged on the substrate holder 101 to grasp the relative positions of the substrate holder 7 and the substrate holder 101. The center of the substrate holder 101 sometimes shifts from the substrate holder 7 and the substrate holder 101 sometimes rotates. For this reason, a plurality of such reference marks are arranged on the substrate holder 101 to grasp both situations.

Using such a normal setup makes it possible to measure, in advance, changes in the positional relationship between the reference mark 502 on the substrate holder 7 and the reference mark 503 on the substrate holder 101 before and after multiple execution of an exposure sequence. Obtaining a thermal expansion coefficient concerning the expansion/contraction of the substrate holder 101 in advance makes it easy to perform a predictive simulation concerning the expansion/contraction amount of the substrate holder 101 at an arbitrary time point from the start of exposure. In addition, when an exposure sequence is provided, the thermal expansion/contraction amounts of the substrate holder 101 at given times from the start of exposure as a start time are stored in the form of a table in advance. Furthermore, the deformation amount of the substrate holder 101 may be estimated by using a thermometer provided in the exposure apparatus.

Letting ($\Delta x'$, $\Delta y'i$) be the displacement amount of the substrate holder 101 at the position of an ith mark 103, this simulation corrects equations (7) as follows:

$$xi = x'i - \Delta x'i + \Sigma zx\_mn(x'i - \Delta x'i)m(y'i - \Delta y'i)n$$

$$yi = y'i - \Delta y'i + \Sigma zy\_mn(x'i - \Delta x'i)m(y'i - \Delta y'i)n$$

The controller 8 stores information concerning the thermal expansion/contraction amount of the substrate holder 101 in a RAM 83 in advance. When actually executing alignment mark measurement via a relay optical system 100, the controller 8 may perform positioning upon reading out this information and correcting the measurement result.

It can be assumed that information concerning the tilt or aberration of a principal ray at each image height which occurs in the relay optical system 100, stored in the RAM 83, changes over time due to factors other than exposure heat. In this case, actual measurement like that in the first embodiment may be periodically executed, and the old information stored in the storage device may be replaced with the information concerning the tilt or aberration of a principal ray at each image height which occurs in the relay optical system 100, obtained as a result of the execution.

Third Embodiment

An exposure apparatus according to the third embodiment will be described next. The first embodiment has been described on the assumption that the height position z of the mark 103 on the substrate is known. As described above, however, in a process actually used to manufacture a device, the indefiniteness of the height position z of the mark 103 is large, and hence the height position z may not be used as a known parameter in practice in some cases.

The third embodiment will exemplify a method that can be applied to such a case. First of all, a substrate 102 is variously processed and a thickness h (see FIG. 3) of the substrate changes along with the process. Because a height position z of a mark 103 falls within the range of 0≤z≤h, the manner of determining the thickness h will be considered first.

A height sensor using reflected light is mounted in a general exposure apparatus. A difference Δh1 between the height of a reference mark 502 on the stage and the height of the upper surface of the substrate 102 (thickness h0) before a process placed on a substrate holder 101 can be measured in advance by reflected light measurement. The substrate 102 whose thickness has changed along with process is placed on the substrate holder 101, and a difference Δh2 from the height of the upper surface of the reference mark 502 on the stage is measured in the same manner. This makes it possible to calculate the thickness h of the substrate 102 whose thickness has changed along with the process according to h0−Δh1+Δh2. In the above operation, the height of a reference mark 503 on the substrate holder 101 may be measured instead of the height of the reference mark 502 on the stage.

Upon determining the height h of the substrate 102 during the process, the controller 8 captures the mark 103 in the visual field of a relay optical system 100. The controller 8 then searches for a point at which the contrast of the mark 103 is optimized while changing a substrate holder 7 in the z direction within the range of 0≤z≤h. This makes it possible to know the accurate position z of the mark 103 on the substrate in the height direction.

Substituting the expansion coefficients, obtained as a result of substituting the value of z obtained in this manner into equations (6), into equations (7) or (8) enables reverse surface alignment corresponding to various processes.

In step S9 in FIG. 5, the expansion coefficients $zx\_mn$ and $zy\_mn$ calculated according to equations (6) are stored in the RAM 83. However, when the height position z is obtained separately as in this embodiment, the expansion coefficients $zx\_mn$ and $zy\_mn$ calculated according to equations (5) may be stored in the RAM 83 in step S9. Substituting the height position z of the mark obtained in accordance with the embodiment and the expansion coefficients $zx\_mn$ and $zy\_mn$ stored in the RAM 83 into equations (6) enables calculation of the expansion coefficients $zx\_mn$ and $zy\_mn$ dependent on the height position z.

Fourth Embodiment

An exposure method according to an embodiment of the present invention will be described next. In order to execute this exposure method, information concerning the aberration and telecentricity of a relay optical system 100 is obtained in advance by processing complying with the flowchart of FIG. 4 according to the first embodiment or the method described in the second embodiment. A substrate subjected to actual exposure is fed into an exposure apparatus and placed on a mechanism for holding the substrate. An imaging optical system 110 then captures an image of a mark 103 provided on the substrate which is obtained via the relay optical system 100. A controller 8 then corrects the image shift amount of the observed mark 103 according to equations (7) based on information concerning the aberration and telecentricity of the relay optical system 100 which is read out from a RAM 83. Finally, the exposure apparatus executes positioning based on information concerning the position of the mark 103 obtained after correction and performs exposure.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of transferring the pattern of an original onto a substrate using the above-described lithography apparatus (an exposure apparatus, an imprint apparatus, a drawing apparatus, or the like), and a step of processing the substrate onto which the pattern has been transferred in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, the quality, the productivity, and the production cost of the article, as compared to a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-059923, filed Mar. 24, 2017, which is hereby incorporated by reference herein in its entirety.

What is claimed is:

1. A detection apparatus that detects a mark formed on a substrate, the apparatus comprising:
   a substrate holder having a holding surface for holding the substrate;
   an optical system accommodated in the substrate holder;
   an image sensor configured to capture an image of the mark from a lower surface side of the substrate through the optical system; and a processor configured to perform detection processing for the mark based on the image of the mark captured by the image sensor, wherein the processor is configured to correct a detection value of the mark based on a distance between the mark and the holding surface of the substrate holder in a height direction and information concerning telecentricity of the optical system, and wherein the processor obtains the information concerning telecentricity of the optical system based on a detection value of the mark when the distance is a first distance and a detection value of the mark when the distance is a second distance different from the first distance.

2. The apparatus according to claim 1, wherein the processor is configured to correct a detection value of a position of the detected mark.

3. The apparatus according to claim 1, wherein the telecentricity includes information concerning a tilt of a principal ray at each image height of the optical system.

4. The apparatus according to claim 1, wherein the processor is configured to correct the detection value by using a correction function using a coordinate value of a position of the mark as a variable.

5. The apparatus according to claim 4, wherein the correction function includes a coefficient dependent on the distance.

6. The apparatus according to claim 1, wherein the processor is configured to obtain information concerning the telecentricity in a calibration mode by obtaining a first detection value of a position of a first mark on an adjustment substrate by capturing an image of the first mark from an upper surface side of the adjustment substrate without going through the optical system using the image sensor and obtaining a second detection value of the position of the first mark by capturing an image of the first mark from a lower surface side of the adjustment substrate through the optical system using the image sensor in each of a state in which a distance between the first mark on the adjustment substrate held by the substrate holder and the holding surface of the substrate holder in a height direction is a first distance and a state in which the distance is a second distance different from the first distance.

7. The apparatus according to claim 6, wherein the distance is changed by reversing the adjustment substrate.

8. The apparatus according to claim 1, wherein the processor is configured to further correct the detection value based on an estimated deformation amount of the substrate holder.

9. The apparatus according to claim 8, wherein the processor is configured to estimate the estimated deformation amount based on a thermal expansion coefficient concerning thermal expansion/contraction of the substrate holder.

10. The apparatus according to claim 1, further comprising a measurement unit configured to measure a position of the mark in the height direction.

11. A pattern forming apparatus that forms a pattern on a substrate, the apparatus comprising a detection apparatus that detects a mark formed on the substrate, wherein the detection apparatus comprises:
a substrate holder having a holding surface for holding the substrate;
an optical system accommodated in the substrate holder;
an image sensor configured to capture an image of the mark from a lower surface side of the substrate through the optical system; and a processor configured to perform detection processing for the mark based on the image of the mark captured by the image sensor, wherein the processor is configured to correct a detection value of the mark based on a distance between the mark and the holding surface of the substrate holder in a height direction and information concerning telecentricity of the optical system, and wherein the processor obtains the information concerning telecentricity of the optical system based on a detection value of the mark when the distance is a first distance and a detection value of the mark when the distance is a second distance different from the first distance.

12. An obtaining method of obtaining characteristic information of an optical system accommodated in a substrate holder configured to hold a substrate, the method comprising obtaining information concerning telecentricity of the optical system by obtaining a first detection value of a position of a first mark on an adjustment substrate by capturing an image of the first mark from an upper surface side of the adjustment substrate held by the substrate holder without going through the optical system using an image sensor and obtaining a second detection value of the position of the first mark by capturing an image of the first mark from a lower surface side of the adjustment substrate through the optical system using the image sensor in each of a state in which the first mark on the adjustment substrate held by the substrate holder is at a first height position and a state in which the first mark is at a second height position different from the first height position.

13. A method of detecting a mark formed on a substrate, the method comprising:
detecting the mark from a lower surface side of the substrate by using an optical system accommodated in a substrate holder configured to hold the substrate;
obtaining information concerning telecentricity of the optical system; and
correcting a detection value of a position of the detected mark based on a position of the mark on the substrate in a height direction and information concerning the obtained telecentricity of the optical system,
wherein the information concerning telecentricity of the optical system is obtained by an obtaining method of obtaining characteristic information of an optical system accommodated in a substrate holder configured to hold a substrate,
wherein the obtaining method comprises obtaining information concerning telecentricity of the optical system by obtaining a first detection value of a position of a first mark on an adjustment substrate by capturing an image of the first mark from an upper surface side of the adjustment substrate held by the substrate holder without going through the optical system using an image sensor and obtaining a second detection value of the position of the first mark by capturing an image of the first mark from a lower surface side of the adjustment substrate through the optical system using the image sensor in each of a state in which the first mark on the adjustment substrate held by the substrate holder is at a first height position and a state in which the first mark is at a second height position different from the first height position.

14. An article manufacturing method comprising:
forming a pattern on a substrate by using a pattern forming apparatus; and
processing the substrate on which the pattern is formed, wherein an article is manufactured from the processed substrate,
wherein the pattern forming apparatus includes a detection apparatus that detects a mark formed on the substrate,
wherein the detection apparatus comprises:
a substrate holder having a holding surface for holding the substrate;
an optical system accommodated in the substrate holder;
an image sensor configured to capture an image of the mark from a lower surface side of the substrate through the optical system; and
a processor configured to perform detection processing for the mark based on the image of the mark captured by the image sensor,
wherein the processor is configured to correct a detection value of the mark based on a distance between the mark and the holding surface of the substrate holder in a height direction and information concerning telecentricity of the optical system, and
wherein the processor obtains the information concerning telecentricity of the optical system based on a detection value of the mark when the distance is a first distance and a detection value of the mark when the distance is a second distance different from the first distance.

15. A detection apparatus that detects a mark formed on a substrate, the apparatus comprising:
a substrate holder configured to hold the substrate;
an optical system including a first optical element accommodated in the substrate holder and configured to change an optical path of a light that irradiates the first optical element and a second optical element accommodated in the substrate holder and configured to change an optical path of a light that irradiates the second optical element;
an image sensor configured to capture an image of the mark from a lower surface side of the substrate through the optical system; and
a processor configured to perform detection processing for the mark based on the image of the mark captured by the image sensor,
wherein the processor is configured to correct a detection value of the mark based on a position of the mark on the substrate in a height direction and information concerning telecentricity of the optical system that includes the first optical element and the second optical element.

16. The apparatus according to claim 15, wherein the information concerning the telecentricity includes a tilt of a principal ray of light traversing an optical path disposed in the substrate holder and between the first optical element and the second optical element.

17. The apparatus according to claim 15, wherein the processor is configured to adjust a distance between the image sensor and the substrate holder to focus the image sensor on the image of the mark.

18. A pattern forming apparatus that forms a pattern on a substrate, the apparatus comprising a detection apparatus that detects a mark formed on the substrate,
wherein the detection apparatus comprises:
a substrate holder configured to hold the substrate;
an optical system including a first optical element accommodated in the substrate holder and configured to change an optical path of a light that irradiates the first optical element and a second optical element accommodated in the substrate holder and configured to change an optical path of a light that irradiates the second optical element;
an image sensor configured to capture an image of the mark from a lower surface side of the substrate through the optical system; and
a processor configured to perform detection processing for the mark based on the image of the mark captured by the image sensor,
wherein the processor is configured to correct a detection value of the mark based on a position of the mark on the substrate in a height direction and information concerning telecentricity of the optical system that includes the first optical element and the second optical element.

19. An article manufacturing method comprising:
forming a pattern on a substrate by using a pattern forming apparatus; and
processing the substrate on which the pattern is formed,
wherein an article is manufactured from the processed substrate,
wherein the pattern forming apparatus includes a detection apparatus that detects a mark formed on the substrate,
wherein the detection apparatus comprises:
a substrate holder configured to hold the substrate;
an optical system including a first optical element accommodated in the substrate holder and configured to change an optical path of a light that irradiates the first optical element and a second optical element accommodated in the substrate holder and configured to change an optical path of a light that irradiates the second optical element;
an image sensor configured to capture an image of the mark from a lower surface side of the substrate through the optical system; and
a processor configured to perform detection processing for the mark based on the image of the mark captured by the image sensor,
wherein the processor is configured to correct a detection value of the mark based on a position of the mark on the substrate in a height direction and information concerning telecentricity of the optical system that includes the first optical element and the second optical element.

20. A detection apparatus that detects a mark formed on a substrate, the apparatus comprising:
a substrate holder configured to hold the substrate;
an optical system accommodated in the substrate holder;
an image sensor configured to capture an image of the mark from a lower surface side of the substrate through the optical system; and
a processor configured to perform detection processing for the mark based on the image of the mark captured by the image sensor,
wherein the processor is configured to correct a detection value of the mark based on a position of the mark on the substrate in a height direction and information concerning telecentricity of the optical system,
wherein the processor is configured to obtain information concerning the telecentricity in a calibration mode by obtaining a first detection value of a position of a first mark on an adjustment substrate by capturing an image of the first mark from an upper surface side of the adjustment substrate without going through the optical system using the image sensor and obtaining a second detection value of the position of the first mark by capturing an image of the first mark from a lower surface side of the adjustment substrate through the optical system using the image sensor in each of a state in which the first mark on the adjustment substrate held by the substrate holder is at a first height position and a state in which the first mark is at a second height position different from the first height position.

* * * * *